(12) United States Patent
Okada

(10) Patent No.: US 6,483,567 B1
(45) Date of Patent: *Nov. 19, 2002

(54) IMAGE PROCESSING DEVICE

(75) Inventor: Satoshi Okada, Zama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/365,900

(22) Filed: Aug. 3, 1999

(30) Foreign Application Priority Data

Aug. 4, 1998 (JP) ............................................. 10-220347
Jul. 26, 1999 (JP) ............................................. 11-210189

(51) Int. Cl.[7] ........................ G02F 1/133; H04N 5/335; H01L 27/12
(52) U.S. Cl. ........................ 349/158; 349/149; 349/58; 250/208.1
(58) Field of Search ........................ 349/58, 149, 150, 349/161, 158, 122; 250/208.1, 484.2; 347/263, 238; 257/59, 472

(56) References Cited

U.S. PATENT DOCUMENTS 4,558,510 A * 12/1985 Tani et al. ................... 257/687
5,528,403 A * 6/1996 Kawaguchi et al. ......... 349/149
5,707,749 A * 1/1998 Katagiri et al. .......... 428/473.5
6,323,891 B1 * 11/2001 Kitani et al. ................. 347/263

* cited by examiner

Primary Examiner—William L. Sikes
Assistant Examiner—Tai V. Duong
(74) Attorney, Agent, or Firm—Fitzpatrick, Cella, Harper & Scinto (57) ABSTRACT

To prevent a pitch shift between sensor panels when the temperature changes, in an image processing device having first boards having a thermal expansion coefficient a and a plurality of semiconductor elements or/and wiring lines formed on at least one board at an equal pitch P, and a second board having a thermal expansion coefficient b and opposing and bonded to the first board through bonding means, letting L be a length of the first board in a direction of array of the semiconductor elements or/and the wiring lines on the first board opposing the second board and T be a width of a temperature guarantee range of the image processing device, $-P/2<LT(a-b)<P/2$ is satisfied.

13 Claims, 6 Drawing Sheets

IMAGE PROCESSING DEVICE

BACKGROUND OF THE INVENTION

1. Field of the Invention

The present invention relates to an image processing device and, more particularly, to an image processing device such as an optical sensor, liquid crystal display, or plasma display for reading or displaying image information.

2. Related Background Art

An X-ray examination apparatus used in the medical field employs, as a mainstream, a scheme of converting an X-ray into visible light by a fluorescent plate and exposing a film in contact with the fluorescent plate to the light for confirmation because a morbid portion of a patient must be accurately detected. In fact, the following problems are pointed out in association with this confirmation method: it takes a time from measurement to diagnosis although the resolution of an image has no problem for practical use, and specifying a measurement position (e.g., morbid portion) greatly depends on the skill and intuition of the technician.

In recent years, large area sensors using amorphous silicon diodes have been developed and increased in their reliability. When amorphous silicon is used, the area can be easily increased. Along with this advantage, an urgent demand has arisen for developing a device for increasing the efficiency of the conventional X-ray examination for diagnosing a morbid portion of a patient by using an emphasized image processed in real time. To largely change the panel formation process size at once to achieve a large area sensor, new investment for plants and equipment for the film formation and photo-process is impractically required. Hence, actually, a plurality of panels having an existing process size are two-dimensionally bonded in accordance with the pixel pitch.

Figure 1:
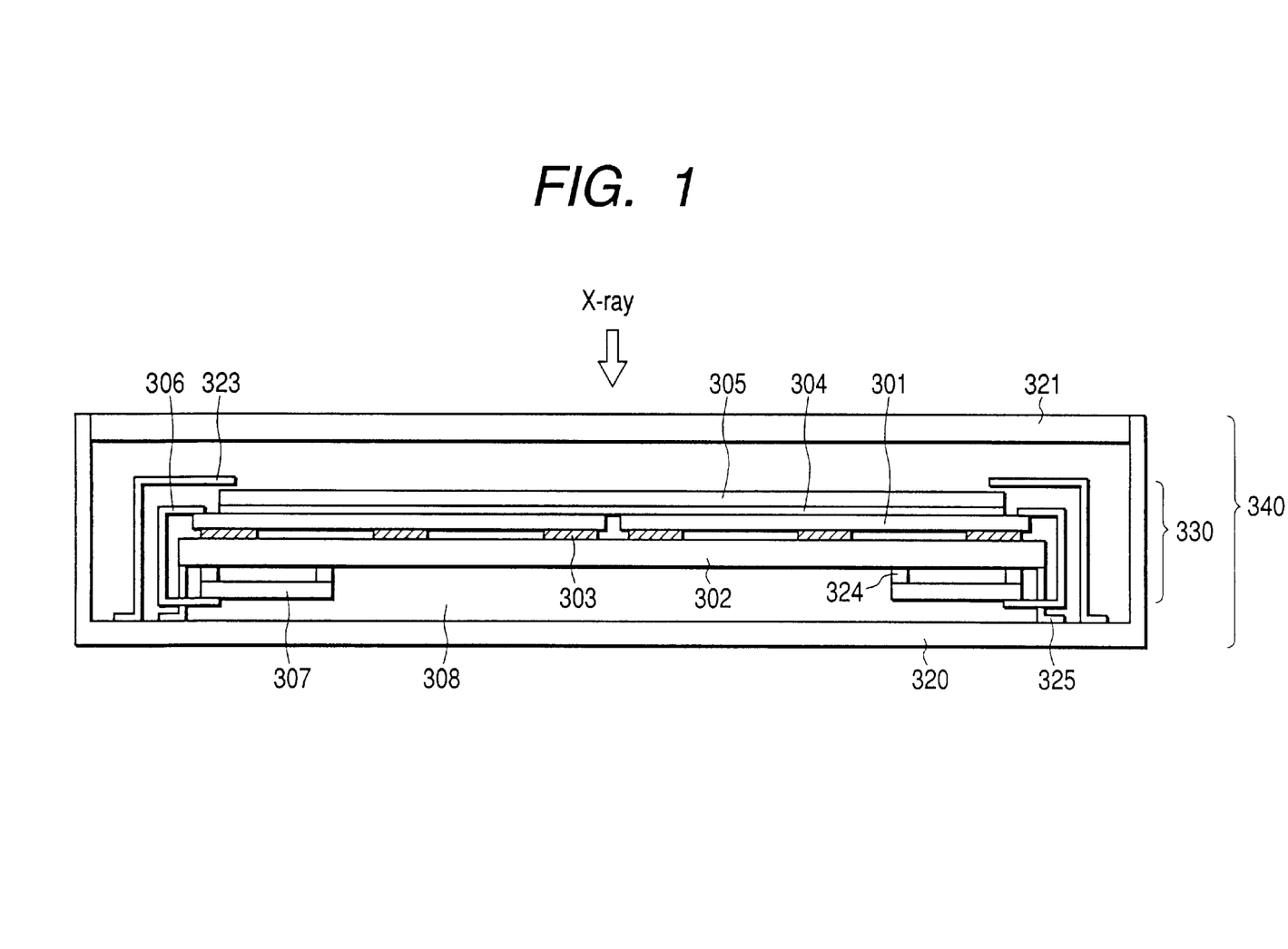
FIG. 1 is a schematic sectional view for explaining an example of an image processing device.

FIG. 1 is a schematic sectional view showing an X-ray sensor manufactured by bonding. Referring to FIG. 1, each sensor panel 301 comprises a board made of non-alkali glass or the like. A base 302 fixes four sensor panels 301 at predetermined positions and has an X-ray absorption lead member for protecting an electrical mounted portion on the lower surface. A first bonding layer 303 bonds the sensor panels 301 to the base 302. A fluorescent plate 305 serves as a wavelength conversion member for converting an X-ray into visible light. A gel-like second bonding layer 304 bonds the fluorescent plate 305 to the sensor panels 301. Printed circuit boards 307 electrically drive the sensor panels 301, respectively. Flexible wiring boards 306 connect the printed circuit boards 307 to the sensor panels 301, respectively. The members 301 to 307 form an X-ray sensor portion 330.

The X-ray sensor also has a case 320, a lid 321, a cover 323 formed from, e.g., lead to protect the electrical mounted portion, legs 324 for fixing the printed circuit boards 307, and angles 325 for fixing the base 302 to the case 320. The members 320 to 325 form a chassis portion 340. The X-ray sensor unit is formed by fixing the X-ray sensor portion 330 in the chassis portion 340.

An X-ray incident from the upper side in FIG. 1 as image information is converted into a visible light wavelength by the fluorescent plate 305, transmitted through the transparent second bonding layer 304, and is incident on optical sensor elements (photoelectric conversion elements) two-dimensionally arrayed on the upper surface of each sensor panel. The incident light is converted into an electrical signal by the optical sensor elements and converted into image information by the printed circuit boards 307 through the flexible wiring boards 306, so the X-ray sensor functions as a two-dimensional X-ray sensor.

A technical point that must be taken into consideration in selecting the structure of such a two-dimensional X-ray sensor is that the four sensor panels need be accurately aligned relative to each other in the planar direction to ensure a high resistance to mechanical impact in bonding the fluorescent plate because of the small pixel pitch. Usually, for the first bonding layer 303, a silicone-based cold-setting adhesive, which rarely expands/shrinks in hardening and has a strong adhesion and elasticity after hardening is used.

A normal temperature guarantee range of an X-ray sensor is −30° C. to +50° C. The technical problem described in the prior art must be solved within this temperature range. However, in this structure, since the thermal expansion coefficient of the sensor panel 301 as $4.7 \times 10^{-6}/°$ C. and that of the base 302 as $2.9 \times 10^{-5}/°$ C. have a large difference (this difference normally appears in use of the above-described materials), and therefore, the difference in expansion/shrinkage due to the temperature difference of 80° C. is as large as 617%. When the outer size of each sensor panel 301 is 250 mm, the expansion/shrinkage difference of 486 $\mu$m directly appears as a pixel pitch shift because of the elastic force of the adhesive 303. When the pixel pitch of the X-ray sensor is 160 $\mu$m, this shift amount cannot be neglected. In addition, when the sensor panel 301 and base 302 have the same thickness in terms of mechanical strength, they largely warp. When the base 302 has a sufficient thickness in terms of mechanical strength with respect to the sensor panel 301, large internal stress is generated in the sensor panel to degrade the characteristics of the element and also peel the adhesive 303. This tendency becomes conspicuous as the screen size increases.

SUMMARY OF THE INVENTION

It is an object of the present invention to provide a structure for suppressing a pitch shift between bonded sensor panels or opposing panels particularly in an image processing device having a large screen even when the temperature changes.

It is another object of the present invention to provide a structure for suppressing warp, internal stress, and peeling in bonded panels.

It is still another object of the present invention to provide an inexpensive image processing device having excellent cost performance and an arrangement capable of facilitating selection of materials to be used and proper design and shortening the development period.

It is still another object of the present invention to provide an image processing device having at least one first board having a thermal expansion coefficient a and a plurality of semiconductor elements or/and wiring lines at an equal pitch P, and a second board having a thermal expansion coefficient b and opposing and bonded to the first board through bonding means, wherein letting L be a length of the first board in a direction of array of the semiconductor elements or/and the wiring lines on the first board opposing the second board and T be a width of a temperature guarantee range of the image processing device, $$-P/2 < LT(a-b) < P/2$$

is satisfied.

According to the present invention, even when the temperature changes, the pixel pitch shift between the first panel and second panel which oppose and are bonded to each other or relative pixel pitch shift between the plurality of first panels can be prevented or minimized. In addition, warp or internal stress can be suppressed, and peeling can be prevented.

According to the present invention, a design concept capable of preventing or avoiding problems posed by a change in temperature due to a change in use conditions or the like can be provided.

According to the present invention, an image processing device which can be designed in a shorter developing period and has more excellent cost performance because materials to be used can be appropriately selected in accordance with the required performance and cost can be provided.

DESCRIPTION OF THE PREFERRED EMBODIMENTS

In the present invention, a number of experiments have revealed that the above objects can be achieved by considering the thermal expansion coefficient of a board on which a semiconductor element or wiring line is formed, the pitch between elements or wiring lines, the length of the layout of the elements or wiring lines, the thermal expansion coefficient of a base on which the boards are laid out, and an assumed temperature range.

The present invention will be described below with reference to the accompanying drawings.

(First Embodiment)

A flat panel sensor (photoelectric conversion device) using a semiconductor element or a TFT (Thin Film Transistor) generally uses non-alkali glass ($4.7 \times 10^{-6}/°$ C.) or quartz glass ($5.5 \times 10^{-7}/°$ C.) to prevent degradation in semiconductor characteristics. A simple matrix display having no semiconductor elements uses inexpensive soda glass ($1 \times 10^{-5}/°$ C.) in consideration of cost. Generally, a flat panel sensor has a pixel pitch of 150 to 200 $\mu$m, and a display has a pixel pitch of 50 to 200 $\mu$m.

Figure 2:
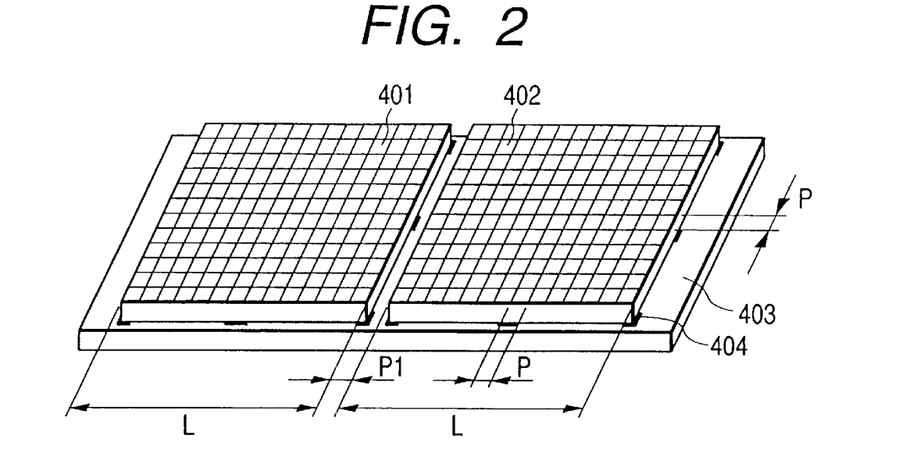
FIG. 2 is a schematic perspective view for explaining the arrangement of an image processing device.
Figure 3A:
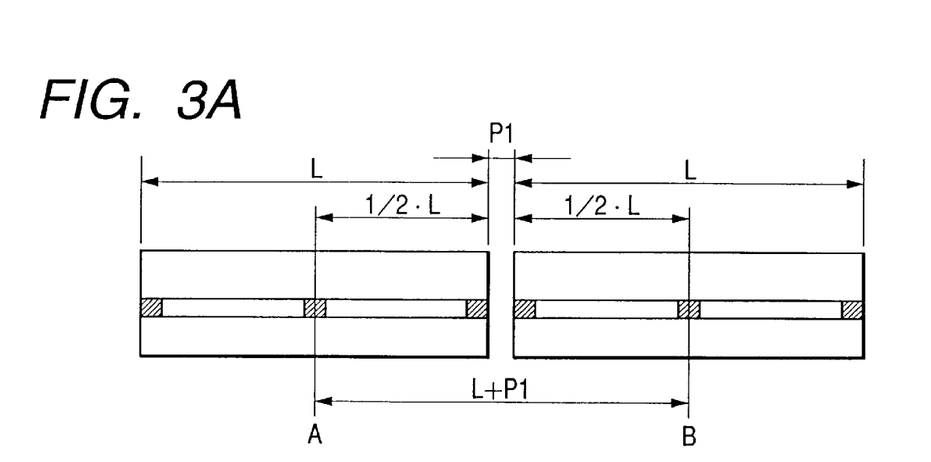
FIGS. 3A and 3B are schematic sectional views for explaining the positional relationship of panels arranged.
Figure 3B:
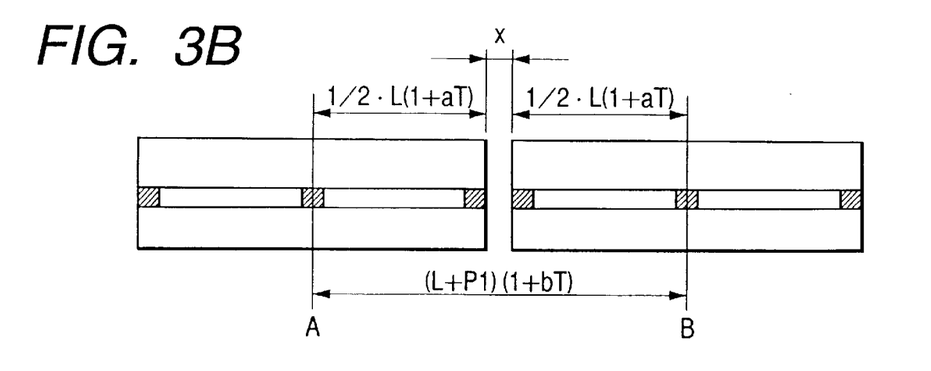

FIG. 2 is a schematic perspective view showing an example in which two small panels are bonded. The sensor has area sensor panels 401 and 402 two-dimensionally arranged at an equal pitch P, a base 403, and an adhesive 404 for bonding the sensor panels to the base. Each of the area sensor panels 401 and 402 has a pixel area with a size of L×L and a thermal expansion coefficient a. The base has a thermal expansion coefficient b. As shown in FIG. 2, a pixel pitch P1 between the panels equals the sensor pitch P. FIG. 3A is a schematic sectional view of the structure shown in FIG. 2. When the temperature of this structure changes, the two sensor panels on the upper side expand in an equal amount from the respective centers, so the relative positions of the sensor panels at points A and B with respect to the base on the lower side do not change. For this reason, a change in pitch P1 between the two sensor panels upon expansion/shrinkage due to a temperature difference T in this structure is considered only between the points A and B. When the adhesive is made of a soft material, i.e., a deformable material, the sensor panels and base expand/shrink without interfering each other. FIG. 3B is a schematic sectional view showing the structure when the temperature increases by T. The distance between the points A and B without any change in temperature is L+P1, and that when the temperature increases by T is (L+P1)(1+bT). A pitch X between the panels is given by $$X = (L+P1)(1+bT) - 2 \times 1/2 \cdot (1+aT)$$

This equation can be rearranged to $$X = LT(b-a) + P1 + P1bT \qquad (1)$$

If a>b, the pitch X becomes smaller than the initial pitch. Assuming that the limitation of the pitch X is 1/2 the pixel size, X>1/2P. Since P1=P, a substitution of this into equation (1) yields $$-P(1/2 + bT) < LT(b-a) \qquad (2)$$

Since $$bT << 1/2 \qquad (3)$$

inequality (2) can be approximated to $$-1/2P < LT(b-a) \qquad (4)$$

When a<b, the pitch X increases. Assuming that the limitation of an increase is 1/2 the pixel size, X<3/2P. A substitution of this into equation (1) yields $$P(1/2 - bT) > LT(b-a) \qquad (5)$$

From inequality (3), inequality (5) can be approximated to $$1/2P > LT(b-a) \qquad (6)$$

Inequalities (4) and (6) can be rewritten to $$-1/2P < LT(b-a) < 1/2P \qquad (7)$$

When inequality (7) is multiplied by −1, $$-1/2P < LT(a-b) < 1/2P \qquad (8)$$

Figure 4:
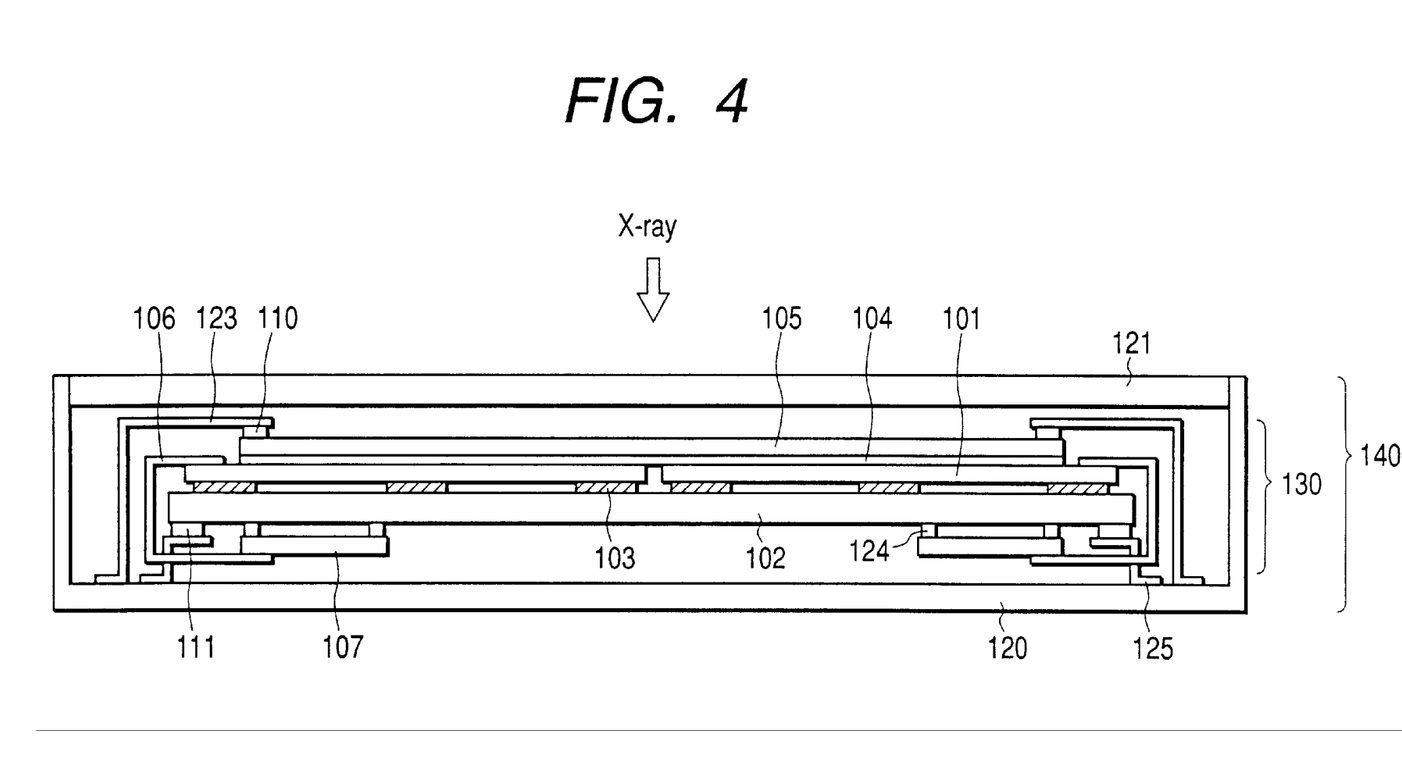
FIGS. 4, 5, 6 and 7 are schematic sectional views for explaining image processing deviceces.

FIG. 4 is a sectional view of an X-ray sensor unit according to the first embodiment of the present invention. Referring to FIG. 4, the X-ray sensor unit has four sensor panels (first boards) 101 formed from non-alkali glass having a thermal expansion coefficient of $4.7 \times 10^{-6}/°$ C., a base (second board) 102 formed from lead glass with a thermal expansion coefficient of $8.0 \times 10^{-6}/°$ C. to fix the four sensor panels 101 at predetermined positions and absorb a transmitted X-ray, and first bonding layers 103 for bonding the sensor panels 101 to the base 102. The first bonding layers 103 use a silicone-based adhesive exhibiting elasticity upon hardening and point-bond the sensor panels and base. Pixels are arrayed on each sensor panel 101 at a pitch of 160 $\mu$m. A fluorescent plate 105 serves as a wavelength conversion member for converting an X-ray into a visible light wavelength. A soft gel-like second bonding layer 104 for bonding the fluorescent plate 105 to the sensor panels 101. Printed circuit boards 107 electrically drive the sensor panels 101, respectively. Flexible wiring boards 106 connect the printed circuit boards 107 to the sensor panels 101, respectively. The outer size of each sensor panel 101 is almost 230 mm×230 mm. The outer size of the base is almost 460 mm×460 mm. Four sensor panels are bonded to one base. The members 101 to 107 form an X-ray sensor portion 130.

The X-ray sensor also comprises a case 120, a lid 121, a cover 123 formed from, e.g., lead to protect the electrical mounted portion from an X-ray, legs 124 for fixing the printed circuit boards, and angles 125 for fixing the base 102 to the case 120. Damping members 110 are formed from a soft silicone resin or the like press the X-ray sensor portion from the upper side. Support members 111 are formed from a soft silicone resin or the like to support the base 102 of the sensor portion. The members 120 to 125 form a chassis portion 140. The X-ray sensor unit is formed by pressing the X-ray sensor portion by the damping members 110 and support members 111 in the chassis portion 140.

An X-ray incident from the upper side is converted into visible light by the fluorescent plate 105, transmitted through the transparent second bonding layer 104, and is incident on the optical sensor elements two-dimensionally arrayed on the upper surface of each sensor panel. The incident light is converted into an electrical signal by the optical sensor elements. The electrical signal is amplified by the printed circuit boards 107 through the flexible wiring boards 106 and then converted into image information. With this arrangement, the X-ray sensor functions as a two-dimensional X-ray sensor. The cover 123 provided on the upper- and side-surface sides of the X-ray sensor and the base 102 below the X-ray sensor protect the electrical mounted portion from the excessively transmitted X-ray.

In the conventional two-dimensional X-ray sensor unit, since the thermal expansion coefficient of the base 302 and that of the sensor panel 301 have a large difference, large internal stress may be applied to the sensor panels 301 when the temperature changes. In addition, since the relative distance between the connection portions of the four sensor panels depends on the expansion/shrinkage of the base 302 formed from a material different from the sensor panels, and the pitch shift at the connection portion may exceed one pitch.

The thermal expansion coefficient of the sensor panels 101 is $4.7 \times 10^{-6}/°$ C., and the thermal expansion coefficient of the base is $8 \times 10^{-6}/°$ C. Substitutions of the distance L of 230 mm and the temperature T of 80° C. into inequality (8) yield −61 $\mu$m. In this embodiment, since the sensor panels and base are bonded by an elastic silicone-based adhesive, the shift amount is almost reflected on the pitch shift. Since both the boards do not generate extreme stress, the pitch shift can be suppressed within about 38% of the pixel pitch (160 $\mu$m) of the sensor.

The sensor panels 101 are bonded to the fluorescent plate 105 by the gel-like adhesive 104 and therefore can expand/shrink in accordance with a change in temperature while released from the fluorescent plate 105. In addition, since the sensor portion is sandwiched by the support members 111 and damping members 110 both formed from a soft silicone resin or the like, the entire X-ray sensor unit can expand/shrink while released from the chassis portion. As described above, since the four sensor panels 101 and base 102 which are bonded to each other are released from the fluorescent plate 105 and chassis portion 140 for expansion/shrinkage motion, the pitch shift at the connection portion and internal stress can be suppressed, and peeling can be prevented.

In this embodiment, the electric mounted portion can be protected from a X-ray by lead glass used as the base while suppressing the thermal expansion coefficient difference between the sensor panels and the base within the designed value. For this reason, a structure capable of suppressing a pitch shift and peeling without increasing the number of structures in the unit can be provided.

With the designed sizes and conditions of this embodiment, the base can have a thermal expansion coefficient of $3.6 \times 10^{-7}$ to $9 \times 10^{-6}/°$ C. from inequality (8). For example, Pyrex glass ($3.6 \times 10^{-6}/°$ C.), low-alkali glass ($5.1 \times 10^{-6}/°$ C.), or quartz glass ($5.5 \times 10^{-7}/°$ C.) may be selected. Ideally, the sensor panels and base are preferably formed from the same glass material. According to the present invention, the combination of materials can be determined in consideration of cost, compactness, and principle of design.

(Second Embodiment)

Figure 5:
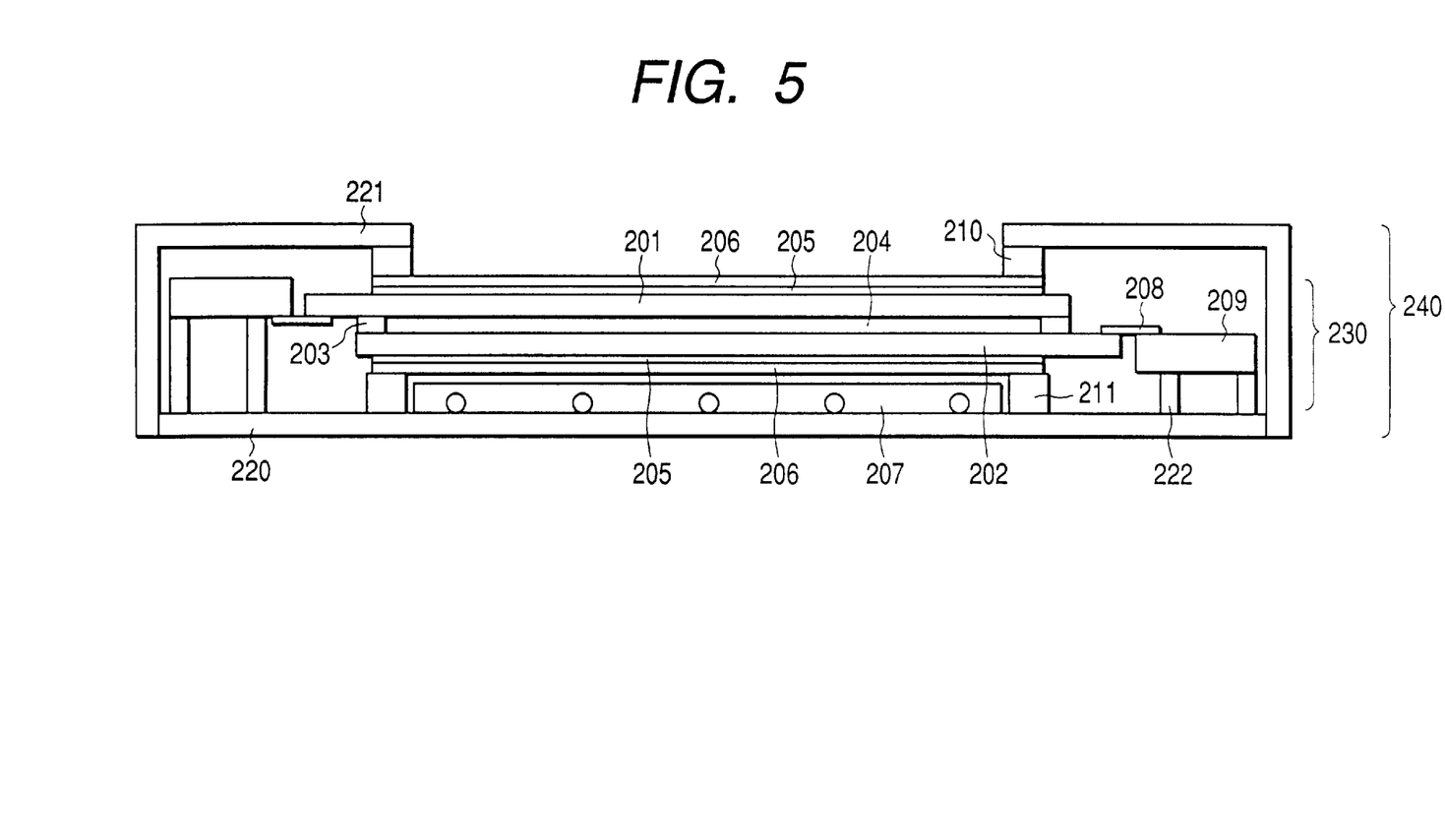

FIG. 5 is a schematic sectional view showing a liquid crystal display unit having a polysilicon TFT (polysilicon thin film transistor) according to the second embodiment of the present invention. Referring to FIG. 5, the liquid crystal display unit comprises a first liquid crystal driving wiring board (first board) 201 formed from non-alkali glass having a thermal expansion coefficient of $4.7 \times 10-6/°$ C., a second liquid crystal driving wiring board (second board) 202 formed from low-alkali glass having a thermal expansion coefficient of $5.1 \times 10^{-6}/°$ C., a sealing agent 203 for encapsulating the liquid crystal and bonding the two liquid crystal driving wiring boards 201 and 202, and a liquid crystal 204. The sealing agent 203 uses a material having a high adhesion and mechanical strength to encapsulate the liquid crystal 204 and suppress the pixel pitch shift of the two opposing liquid crystal driving wiring boards 201 and 202. The liquid crystal display unit also has deflecting plates 206, bonding layers 205 for bonding the deflecting plates 206 to the liquid crystal driving wiring boards 201 and 202, respectively, a backlight 207, printed circuit boards 209 for driving the liquid crystal, and flexible wiring boards 208 for electrically connecting the liquid crystal driving wiring boards 201 and 202 to the printed circuit boards 209, respectively. The members 201 to 209 form a liquid crystal display panel 230.

The liquid crystal display unit also comprises a back body 220, a front body 221, legs 222 for fixing the printed circuit boards 209 to the back body 220, and damping members 210 and 211 formed from a soft silicone resin or the like to fix the liquid crystal display panel to the bodies. The liquid crystal display unit is formed by fixing the liquid crystal display panel by the damping members 210 and 211 in the bodies.

The thermal expansion coefficient of the liquid crystal driving wiring board (first board) 201 is $4.7 \times 10^{-6}/°$ C., and that of the liquid crystal driving wiring board (second board) is $5.1 \times 10^{-6}/°$ C. Substitutions of the distance L of 400 mm and the temperature T of 80° C. into inequality (8) yield −13 $\mu$m. Even when the pixel pitch of the TFT liquid crystal is 80 $\mu$m, the shift amount is only about 17%. The boards fixed in the bodies can expand/shrink in an open state because of the effect of the soft damping members 210 and 211. As a result, the pitch shift between the opposing boards, and warp or internal stress of the boards can be suppressed to the minimum.

The wiring board (first board) on which the polysilicon TFT is to be formed is generally formed from non-alkali glass. However, for the second board opposing the first board, the present invention provides possibility of selection of various materials according to the principle of design such as cost reduction and reliability.

(Third Embodiment)

Figure 6:
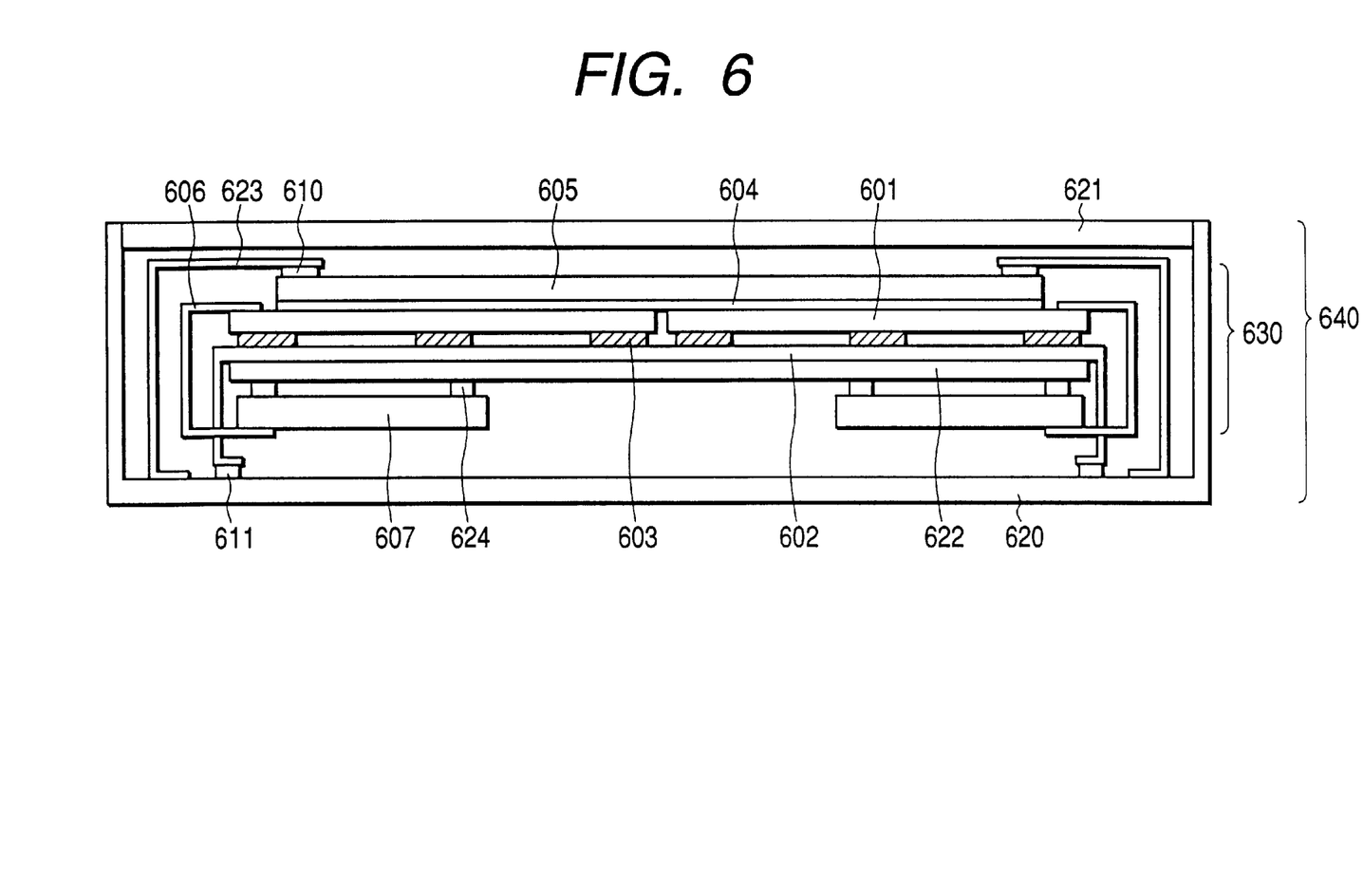

FIG. 6 is a schematic sectional view showing an X-ray sensor unit for use in an automobile according to the third embodiment of the present invention. Referring to FIG. 6, four sensor panels (first board) 601 are formed from soda-lime glass having a thermal expansion coefficient of $1.0 \times 10^{-5}/°$ C. A base (second board) 602 is formed from SUS430 having a thermal expansion coefficient of $1.03 \times 10^{-5}/°$ C. and fixes the four sensor panels 601 at predetermined positions. First bonding layers 603 bond the sensor panels 601 to the base 602. The base is formed by bending a thin plate to reduce the weight while maintaining the rigidity. The first bonding layer 603 uses a silicone-based material exhibiting elasticity upon hardening and point-bonds the sensor panels to the base. Each sensor panel 601 has pixels arrayed at a pitch of 160 μm. A fluorescent plate 605 converts an X-ray into visible light. A gel-like second bonding layer 604 bonds the fluorescent plate 605 to the sensor panels 601. Printed circuit boards 607 electrically drive the sensor panels 601, respectively. Flexible wiring boards 606 connect the printed circuit boards 607 to the sensor panels 601, respectively. The outer size of each sensor panel 601 is about 230 mm×230 mm. The outer size of the base is almost 460 mm×460 mm. Four sensor panels are bonded to one base. The members 601 to 607 form an X-ray sensor portion 630.

The X-ray sensor unit also comprises a case 620, a lid 621, a plate 622 formed from, e.g., lead to protect the electrical mounted portion on the lower side from a transmitted X-ray, a cover 623 formed from, e.g., lead to protect the electrical mounted portion from an X-ray, legs 624 for fixing the printed circuit boards, damping members 610 formed from, e.g., a soft silicone resin to press the X-ray sensor portion from the upper side, and support members 611 formed from a soft silicone resin to support the base 602. The members 620 to 624 form a chassis portion 640. The X-ray sensor unit is formed by pressing the X-ray sensor portion by the damping members 610 and support members 611 in the chassis portion 640.

The thermal expansion coefficient of the sensor panel 601 is $1.0 \times 10^{-5}/°$ C., and that of the base is $1.03 \times 10^{-5}/°$ C. Substitutions of the distance L of 230 mm and the temperature T of 80° C. into inequality (8) yield −5.5 μm. In this embodiment as well, since the sensor panels and base are bonded by the elastic silicone-based adhesive, the shift amount is almost reflected to the pitch shift. For this reason, the sensor panels and base do not generate extreme stress, and the pitch shift can be suppressed within the range of about 4% with respect to the pixel pitch (160 μm) of the sensor.

In addition, since the X-ray sensor portion is sandwiched by the support members 610 and 611 formed from, e.g., a soft silicone resin in the chassis portion, the entire sensor portion can expand/shrink almost independently of the chassis portion. As described above, since the four sensor panels 601 and one base 602, which are bonded, are released from the fluorescent plate 605 and chassis portion for expansion/shrinkage motion, the pitch shift at the connection portion and internal stress can be suppressed, and peeling can be prevented. This structure can also stand a vibration.

In this embodiment, since an SUS material is used instead of glass, the rigidity of the sensor unit can be increased to improve the operability and anti-vibration properties. In addition, the cost can also be reduced by using the inexpensive soda-lime glass for the sensor panels. Hence, the difference in thermal expansion coefficient between the sensor panels and base is suppressed within the designed value while realizing cost reduction and high rigidity of the sensor unit, thereby suppressing the pitch shift and peeling.

In this embodiment, the pixel pitch is 160 μm. When the pixel pitch is set to be, e.g., about 500 μm within the above temperature guarantee range, various SUS materials can be selected, and a more inexpensive material can be used. Conversely, this embodiment can sufficiently cope with a pitch of 160 μm or less.

(Fourth Embodiment)

Figure 7:
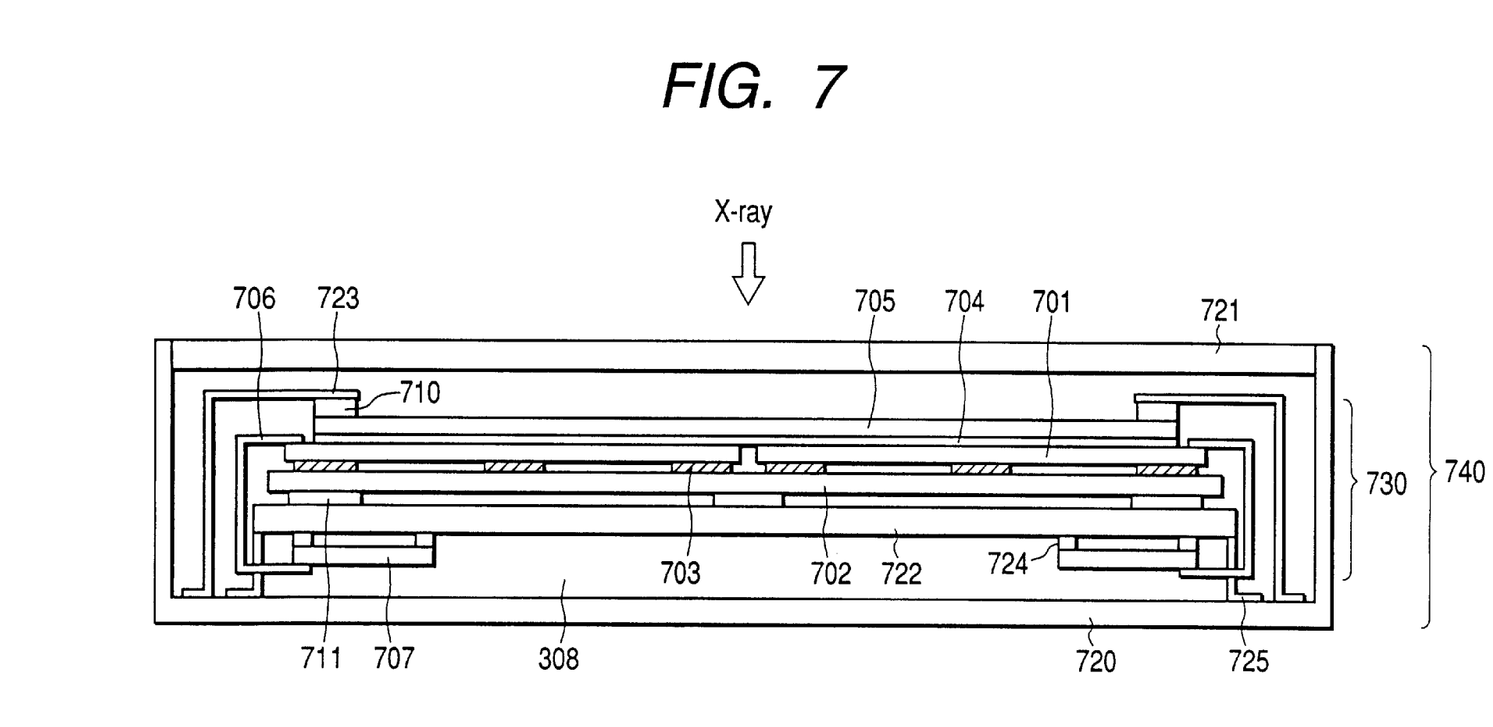

FIG. 7 is a sectional view showing an X-ray sensor unit according to the fourth embodiment. Referring to FIG. 7, four sensor panels (first board) 701 are formed from non-alkali glass having a thermal expansion coefficient of $4.7 \times 10^{-6}/°$ C. A base (second board) 702 is formed from non-alkali glass and fixes the four sensor panels 701 at predetermined positions. First bonding layers 703 bond the sensor panels 701 to the base 702. Each first bonding layer 703 uses a silicone-based material exhibiting elasticity upon hardening and point-bonds the sensor panels to the base. Each sensor panel 701 has pixels arrayed at a pitch of 160 μm. A fluorescent plate 705 converts an X-ray into visible light. A gel-like second bonding layer 704 bonds the fluorescent plate 705 to the sensor panels 701. Printed circuit boards 707 electrically drive the sensor panels 701, respectively. Flexible wiring boards 706 connect the printed circuit boards 707 to the sensor panels 701, respectively. The outer size of each sensor panel 701 is about 230 mm×230 mm. The outer size of the base is almost 460 mm×460 mm. Four sensor panels are bonded to one base. The members 701 to 707 form an X-ray sensor portion 730.

The X-ray sensor unit also comprises a case 720, a lid 721, a plate 722 formed from, e.g., lead to protect the electrical mounted portion on the lower side from an X-ray, a cover 723 formed from, e.g., lead to protect the electrical mounted portion from an X-ray, legs 724 for fixing the printed circuit boards, and angles 725 for fixing the base 702 to the case 720. Damping members 710 are formed from, e.g., a soft silicone resin and press the X-ray sensor portion from the upper side. Support members 711 are formed from a soft silicone resin and support the base 702 of the sensor portion. The members 720 to 725 form a chassis portion 740. The X-ray sensor unit is formed by pressing the X-ray sensor portion by the damping members 710 and support members 711 in the chassis portion 740.

An X-ray incident from the upper side as image information is converted into visible light by the fluorescent plate 705, transmitted through the transparent second bonding layer 704, and is incident on the optical sensor elements two-dimensionally arrayed on the upper surface of each sensor panel. The incident light is converted into an electrical signal by the optical sensor elements. The electrical signal is amplified by the printed circuit boards 707 through the flexible wiring boards 706 and then converted into image information. With this arrangement, the X-ray sensor functions as a two-dimensional X-ray sensor. The cover 723 provided on the upper- and side-surface sides of the X-ray sensor portion and the plate 722 below the X-ray sensor portion protect the electrical mounted portion from the excessively transmitted X-ray.

In a two-dimensional X-ray sensor unit, since the thermal expansion coefficient of a base 302 and that of a sensor panel 301 have a difference, large internal stress may be applied to the sensor panels 301 when the temperature changes, as described above. In addition, since the relative distance between the connection portions of the four sensor panels depends on the expansion/shrinkage of the base 302 formed from a material different from the sensor panels, and the pitch shift may occur at the connection portion.

In the fourth embodiment, the base 702 and sensor panels 701 use non-alkali glass with the same thermal expansion coefficient and are point-bonded by a silicone-based elastic adhesive. Even when the temperature changes, these boards expand/shrink in the same amount. Hence, since the pixel pitch including the connection portions also expands/shrinks in the same manner, no pitch shift occurs at the connection portion.

In addition, since the sensor panels 701 are bonded to the fluorescent plate 705 by the gel-like adhesive 704, they can expand/shrink while released from the fluorescent plate 705 even when the temperature changes. Furthermore, since the X-ray sensor portion is sandwiched by the support members 711 and damping members 710 formed from, e.g., a soft silicone resin in the chassis portion, the entire X-ray sensor portion can expand/shrink while released from the chassis portion. As described above, since the four sensor panels 701 and one base 702, which are bonded, are released from the fluorescent plate 705 and chassis portion 740 for expansion/shrinkage motion, the pitch shift at the connection portion, large internal stress, and peeling can be prevented.

As has been described above, according to the present invention, even when the temperature of the first and second boards opposing and bonded to each other, the pitch shift of pixels can be suppressed. In addition, under the same conditions, internal stress and warp generated in the panels or peeling can be suppressed.

Furthermore, since materials can be easily selected in accordance with the required performance, an unnecessary increase in cost can be prevented. Hence, a more inexpensive image processing device with good cost performance can be provided.

What is claimed is:

1. An image processing device having at least one first board having a thermal expansion coefficient a and a plurality of semiconductor elements or/and wiring lines at an equal pitch P, and a second board having a thermal expansion coefficient b and opposing and bonded to said first board through bonding means, wherein letting L be a length of said first board in a direction of array of said semiconductor elements or/and said wiring lines on said first board and T be a width of a temperature guarantee range of said image processing device, $$-P/2 < LT(a-b) < P/2$$

is satisfied.

2. A device according to claim 1, wherein said bonding means comprises an adhesive.

3. A device according to claim 1, wherein said bonding means comprises a deformable adhesive.

4. A device according to claim 1, wherein said semiconductor element comprises one of a photoelectric conversion element and a thin film transistor.

5. A device according to claim 1, wherein said image processing device comprises a photoelectric conversion device.

6. A device according to claim 1, wherein said image processing device comprises a liquid crystal display device.

7. A device according to claim 1, wherein said semiconductor element comprises a photoelectric conversion element, and a wavelength converter is arranged on a light incident side of said photoelectric conversion element.

8. A device according to claim 7, wherein said wavelength converter has a phosphor.

9. A device according to claim 1, wherein the width of the temperature guarantee range is 80° C.

10. A device according to claim 1, wherein the temperature guarantee range is −30° C. to 50° C.

11. A device according to claim 1, wherein said thermal expansion coefficients a and b are different.

12. A device according to claim 1, wherein a plurality of first boards is provided.

13. A device according to claim 1, wherein a single first board is provided.

* * * * *